(12) United States Patent
Jeon et al.

(10) Patent No.: US 7,365,389 B1
(45) Date of Patent: Apr. 29, 2008

(54) MEMORY CELL HAVING ENHANCED HIGH-K DIELECTRIC

(75) Inventors: Joong Jeon, Cupertino, CA (US); Wei Zheng, Santa Clara, CA (US); Mark Randolph, San Jose, CA (US); Meng Ding, Mountain View, CA (US); Hidehiko Shiraiwa, San Jose, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/008,233

(22) Filed: Dec. 10, 2004

(51) Int. Cl.
*H01L 29/792* (2006.01)

(52) U.S. Cl. ............... 257/325; 257/314; 257/324; 257/325; 257/390; 257/391; 257/E29.304; 257/E29.309

(58) Field of Classification Search ........ 257/314–316, 257/317, 321, 324, 325, 410, 411, E29.129, 257/E29.3, E29.304, E29.309, 390, 391
See application file for complete search history.

(56) References Cited

U.S. PATENT DOCUMENTS

| | | | |
|---|---|---|---|
| 5,688,724 A | 11/1997 | Yoon et al. | 438/778 |
| 5,914,895 A | 6/1999 | Jenne | 365/185.08 |
| 6,090,659 A | 7/2000 | Laibowitz et al. | 438/240 |
| 6,163,049 A | 12/2000 | Bui | 257/321 |
| 6,215,702 B1 | 4/2001 | Derhacobian et al. | |
| 6,407,435 B1 | 6/2002 | Ma et al. | |
| 6,445,030 B1 | 9/2002 | Wu et al. | 257/315 |
| 6,559,014 B1 | 5/2003 | Jeon | |
| 6,562,491 B1 * | 5/2003 | Jeon | 428/697 |
| 6,617,639 B1 * | 9/2003 | Wang et al. | 257/324 |
| 6,642,573 B1 * | 11/2003 | Halliyal et al. | 257/316 |
| 6,693,004 B1 | 2/2004 | Halliyal et al. | |
| 6,744,675 B1 | 6/2004 | Zheng et al. | |
| 6,750,066 B1 | 6/2004 | Cheung et al. | |
| 6,753,570 B1 * | 6/2004 | Tripsas et al. | 257/315 |
| 6,760,270 B2 | 7/2004 | Chindalore et al. | |
| 6,768,160 B1 | 7/2004 | Li et al. | |
| 6,797,599 B2 * | 9/2004 | Visokay et al. | 438/586 |
| 6,812,517 B2 | 11/2004 | Baker | |
| 6,894,932 B1 | 5/2005 | Melik-Martirosian et al. | 365/185.28 |
| 7,005,695 B1 | 2/2006 | Agarwal | 257/310 |
| 7,034,356 B2 | 4/2006 | Nomoto et al. | |

(Continued)

FOREIGN PATENT DOCUMENTS

DE       29 46 864 A1    6/1980

OTHER PUBLICATIONS

Co-pending U.S. Appl. No. 11/128,392, filed May 13, 2005; entitled: "SONOS Memory Cell Having a Graded High-K Dielectric", by Takashi Whitney Orimoto et al., 31 pages.

(Continued)

*Primary Examiner*—Minhloan Tran
*Assistant Examiner*—Benjamin Tzu-Hung Liu
(74) *Attorney, Agent, or Firm*—Harrity Snyder, LLP (57) ABSTRACT

A semiconductor memory device may include an intergate dielectric layer of a high-K, high barrier height dielectric material interposed between a charge storage layer and a control gate. With this intergate high-K, high barrier height dielectric in place, the memory device may be efficiently erased using Fowler-Nordheim tunneling.

11 Claims, 10 Drawing Sheets

U.S. PATENT DOCUMENTS

| 7,071,538 | B1 | 7/2006 | Shiraiwa et al. | |
|---|---|---|---|---|
| 2002/0024092 | A1* | 2/2002 | Palm et al. | 257/330 |
| 2002/0090808 | A1 | 7/2002 | Jeaon et al. | 438/622 |
| 2003/0062567 | A1 | 4/2003 | Zheng et al. | 257/316 |
| 2003/0122204 | A1 | 7/2003 | Nomoto et al. | 257/406 |
| 2004/0028952 | A1* | 2/2004 | Cartier et al. | 428/698 |
| 2005/0006696 | A1 | 1/2005 | Noguchi et al. | 257/316 |
| 2005/0036391 | A1 | 2/2005 | Tomiie et al. | 365/232 |
| 2006/0032529 | A1 | 2/2006 | Baker | 438/258 |
| 2006/0160303 | A1 | 7/2006 | Ang et al. | |

OTHER PUBLICATIONS

Co-pending U.S. Appl. No. 11/049,855, filed Feb. 4, 2005; entitled: "Non-Volatile Memory Device With Improved Erase Speed", by Joong Jeon et al., 22 pages.

Co-pending U.S. Appl. No. 11/086,310, filed Mar. 23, 2005; entitled: "High K Stack For Non-Volatile Memory", by Wei Zheng et al., 21 pages.

Co-pending U.S. Appl. No. 11/196,434, filed Aug. 4, 2005; entitled: "SONOS Memory Cell Having High-K Dielectric", by Takashi Whitney Orimoto et al., 27 pages.

* cited by examiner

MEMORY CELL HAVING ENHANCED HIGH-K DIELECTRIC

TECHNICAL FIELD

Techniques described herein relate generally to non-volatile memory (NVM) devices, and more specifically, to non-volatile memory devices having an enhanced dielectric layer.

BACKGROUND ART

Conventional semiconductor memory devices may use a memory structure characterized by a vertical stack of a tunnel oxide ($SiO_2$), a polysilicon floating gate over the tunnel oxide, an intergate dielectric over the floating gate, and a control gate over the interlayer dielectric. The vertical stack may be formed on a crystalline silicon substrate. The substrate may include a channel region positioned below the vertical stack and source and drain on opposing sides of the channel region.

One particular type of flash memory cell structure is characterized by a vertical stack that includes an insulating oxide tunnel layer, a charge trapping nitride dielectric layer, an insulating top oxide layer, and a polysilicon control gate, all positioned on top of a crystalline silicon substrate.

In a typical operation, flash memory cells may be programmed by a hot electron injection process that injects electrons from the channel region to the nitride layer to create a negative charge within the nitride layer. The electron injection may be performed by applying a drain-to-source bias along with a high positive voltage on the control gate. The high voltage on the control gate inverts the channel region while the drain-to-source bias accelerates electrons towards the drain region. The electrons are generally accelerated towards the drain region, with some of the electrons being re-directed towards the bottom oxide layer. The accelerated electrons gain enough kinetic energy to cross the bottom oxide layer and enter the nitride layer. The nitride layer stores the injected electrons within traps and thus acts as a charge storing layer.

Once programmed, the charged nitride layer becomes a charge storage layer for the memory cell. The negatively charged charge storage layer causes the threshold voltage of the memory cell to increase, which changes the magnitude of the current flowing between the source and the drain at various control gate voltages. Reading the programmed, or non-programmed, state of the memory cell is based on the magnitude of the current flowing between the source and drain at a predetermined control gate voltage.

The programmed memory cell may eventually need to be erased. One typical erase mechanism is hot hole injection (HHI). In HHI, a negative voltage may be applied to the control gate and the source-to-well and drain-to-well interfaces may be reverse biased. The reverse bias generates hot holes that are attracted to the charge storage layer by the negative voltage applied to the control gate. This causes a net positive charge in the charge storage layer and reduces the threshold voltage of the device.

As semiconductor device feature sizes decrease, the thicknesses of the $SiO_2$ layer, typically used as the intergate dielectric, decrease as well, resulting in the $SiO_2$ layer approaching a thickness on the order of ten angstroms (Å). Unfortunately, thin $SiO_2$ layers may break down when subjected to an electric field, particularly $SiO_2$ layers having thicknesses less than 50 Å (5 nm) thick. It is probable that even for a relatively low gate voltage of 3V, electrons can pass through such thin $SiO_2$ layers by a quantum mechanical tunneling effect. In this manner, a leakage current may undesirably form between the control gate and the charge storage layer, adversely affecting the operability of the device. For example, the leakage current increases exponentially for about a two-fold decrease in thickness of a $SiO_2$ layer. This exponential increase in the $SiO_2$ layer leakage current can significantly affect the operation of semiconductor devices, particularly with regard to reliability and lifetime.

DISCLOSURE OF THE INVENTION

Advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one implementation consistent with principles of the invention, a memory device is provided that includes a gate dielectric formed on a substrate, a charge storage layer formed on the gate dielectric, an intergate dielectric formed on the charge storage layer, the intergate dielectric having a sufficient K value to prevent back gate injection and sufficient barrier height to reduce leakage current, and a control gate formed above the intergate dielectric.

According to another implementation consistent with principles of the invention, an integrated circuit is provided that includes an array of memory cells formed on a semiconductor substrate. Each of the memory cells includes a gate dielectric formed on the substrate, a charge storage layer formed on the gate dielectric, an intergate dielectric formed on the charge storage layer, the intergate dielectric having a sufficient K value to prevent back gate injection and sufficient barrier height to reduce leakage current, and a control gate formed above the intergate dielectric.

According to yet another implementation consistent with principles of the invention, a method is provided for fabricating a non-volatile memory device. The method includes forming at least one dielectric layer on a semiconductor substrate; forming a charge storage layer on the at least one dielectric layer; forming at least one intergate dielectric layer on the charge storage layer; and forming a control gate on the at least one intergate dielectric layer, wherein the intergate dielectric layer has a sufficient K value to prevent back gate injection and sufficient barrier height to reduce current leakage.

BRIEF DESCRIPTION OF THE DRAWINGS

Reference is made to the attached drawings, wherein elements having the same reference number designation may represent like elements throughout. In the drawings.

DETAILED DESCRIPTION

The following detailed description of the invention refers to the accompanying drawings. Also, the following detailed description does not limit the invention. Instead, the scope of the invention is defined by the appended claims and equivalents.

Techniques described below relate to a semiconductor memory device, a method of using the semiconductor memory device, and a method of making the semiconductor memory device. The semiconductor memory device may include an intergate dielectric layer including a high-K dielectric material interposed between the charge storage layer and the control gate. With this intergate high-K dielectric in place, the memory device may be programmed with hot electron injection and erased using Fowler-Nordheim (F-N) tunneling. Although generally described herein as a single layer, it should be understood by those skilled in the art that the intergate dielectric layer of high-K dielectric material may include one or more layers of the same or different dielectric materials, potentially including a combination of high-K dielectric materials and oxide layers.

Figure 1:
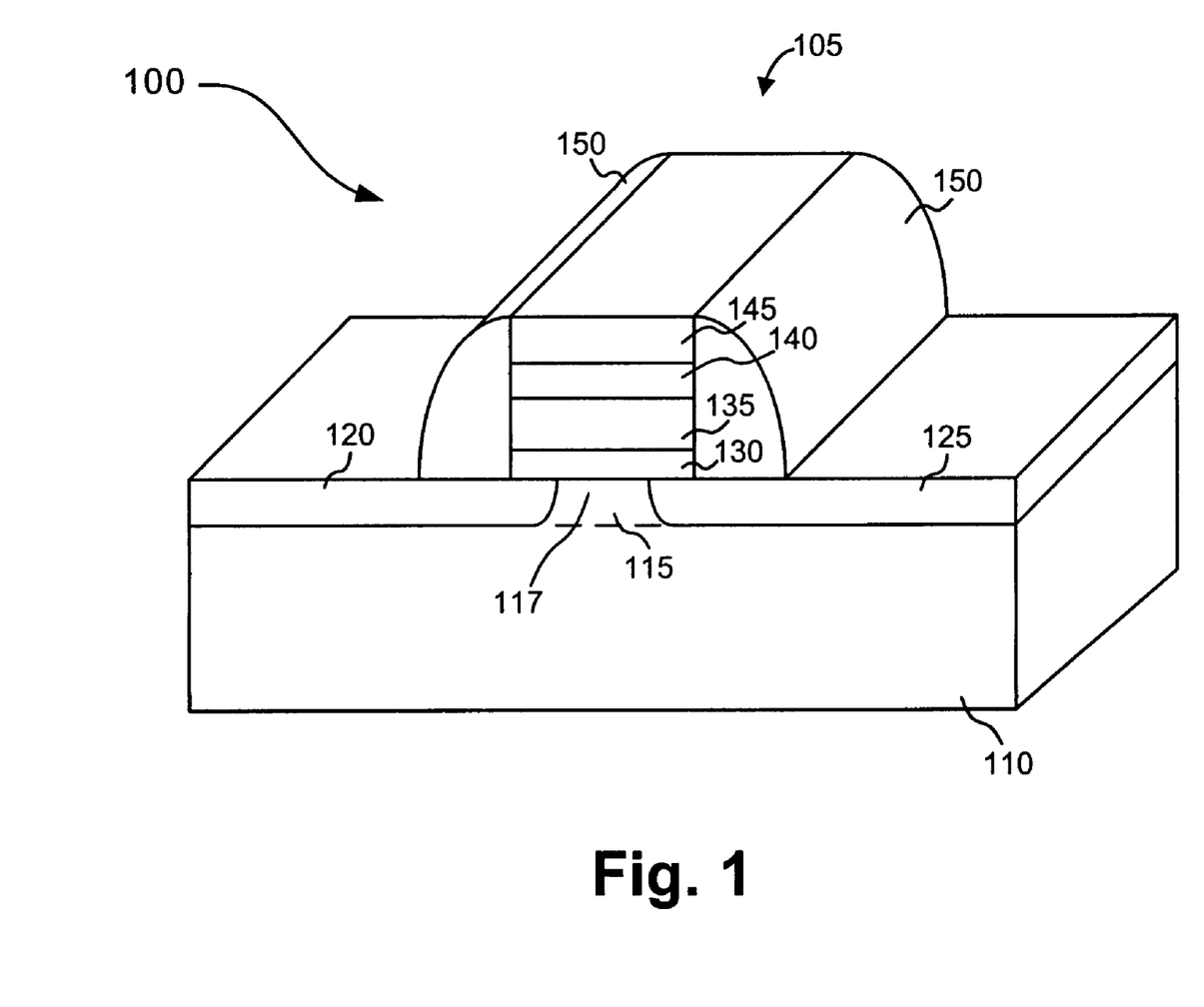
FIG. 1 is a perspective view of a semiconductor device consistent with aspects of the invention.

FIG. 1 is a perspective view of a semiconductor device 100 consistent with aspects of the invention. Device 100 may generally be a memory cell having a vertical stack structure 105. Device 100 is illustrated as a single memory cell. In practice, device 100 will typically be implemented in an array of a large number or array of memory cells formed on a single integrated circuit.

Device 100 may include a semiconductor substrate 110 having an active region 115. A source 120 and a drain 125 are formed in the active region 115. A gate dielectric 130 is formed on the semiconductor substrate 110. A charge storage layer 135 (e.g., a nitride layer) is formed on the gate dielectric 130. Charge storage layer 135 may be electrically isolated from other components in device 100. An intergate dielectric layer 140 is formed on charge storage layer 135. Intergate dielectric layer 140 may be formed of a high-K dielectric material. A control gate 145 is formed on intergate dielectric layer 140. Gate dielectric 130, charge storage layer 135, intergate dielectric layer 140, and control gate 145 form vertical stack 105 of the memory cell. Spacers 150 may be formed on the sidewalls of the vertical stack. Isolation techniques that are known in the art may be used to electrically isolate the semiconductor device 100 from other semiconductor devices.

Semiconductor substrate 110 may include any conventional substrate. For example, semiconductor substrate 110 may include a bulk silicon semiconductor substrates, a silicon-on-insulator (SOI) semiconductor substrate, a silicon-on-sapphire (SOS) semiconductor substrate, or a semiconductor substrate formed of other materials known in the art. The techniques described herein are not limited to any particular type of semiconductor substrate.

Active region 115 may be a p-type region or an n-type region formed in the semiconductor substrate 110. Active region 115 may be pre-doped prior to forming stack 105. Active region 115 may be doped with p-type dopants for n-type channel devices and/or n-type dopants for p-type channel devices.

Source 120 and drain 125 may be two N+ regions formed in the active region 115 of the semiconductor substrate 110. Alternatively, source 120 and the drain 125 may be two P+ regions. Source 120 and drain 125 may be deep or shallow implant regions.

Gate dielectric 130 is shown as a single layer dielectric. Gate dielectric 130 may be made of suitable dielectric materials, such as $SiO_2$. In one implementation, gate dielectric 130 may have a thickness of, for example, between about 20 and 100 Å.

It should be understood by those skilled in the art that the gate dielectric 130 could be formed as a multi-layer dielectric. For example, a layer of $SiO_2$ may be deposited on the semiconductor substrate 110 followed by another dielectric.

Charge storage layer 135 may be made of typical, well-known materials, such as, for example, a nitride material. In one implementation, exemplary charge storage layer 135 may be a nitride layer having a thickness of between about 20 and 100 Å.

Channel 117, formed in active region 115, may be a p-type region interposed between source 120 and drain 125. Alternatively, an n-type channel could be interposed between two P+ source and drain regions, 120, 125.

Intergate dielectric layer 140 may be disposed on charge storage layer 135. Consistent with principles of the invention, intergate dielectric layer 140 may be formed of a high-K dielectric material having certain properties resulting in enhanced erased times and elimination of the deleterious back gate injection phenomenon discussed in additional detail below. As used herein, the term "high-K dielectric" refers to a dielectric material having a dielectric constant (K) greater than that of $SiO_2$ (K=3.9). Examples of high-K dielectric materials include, for example, silicon oxynitride, which has a K of about 4 to about 8 depending on the relative content of oxygen and nitrogen; silicon nitride, which has a K of about 6 to about 9; $Al_2O_3$, which has a K of about 10; composite materials such as hafnium silicate, which has a K of about 14; hafnium silicon oxynitride, which has a K of about 16, depending on the relative content of oxygen and nitrogen; hafnium silicon nitride, which has a K of about 18; $HfO_2$, $ZrO_2$, $Ta_2O_5$ and others.

Using a dielectric material with a higher K value for one or more of the layers of intergate dielectric layer 140 allows a high capacitance and an electrical equivalent thickness of a thinner conventional ONO layer to be achieved. Thus, through the use of high-k materials an intergate dielectric layer 140 formed, for example, of $Al_2O_3$ may have an electrical equivalent thickness of 4 Å of $SiO_2$, yet would have a physical thickness of about 10 Å, thereby reducing the likelihood of back gate injection from control gate 145 to charge storage layer 135.

Implementations consistent with the invention also improve erase times by enhancing the effective barrier height of the materials used. As used herein, the phrase "barrier height" refers to a difference between a potential at a surface of a semiconductor and a potential in the bulk of the semiconductor, where materials exhibiting higher barrier heights with respect to adjacent materials have improved leakage current performance over those having lower barrier heights. For example, $Al_2O_3$ with a barrier height of about 2.8 electron volts (eV) generally exhibits superior leakage current performance than $HfO_2$ with a barrier height of about 1.5 eV.

In accordance with principles of the invention, intergate dielectric layer 140 may be formed to include a mixture of various materials that combine to form a layer exhibiting both a high K-value and a high barrier height, thereby offering superior leakage current performance as well as protection from back gate injection. In one exemplary implementation, intergate dielectric layer 140 may include hafnium oxide (e.g., $HfO_2$, K=20, barrier height 1.5 eV) mixed with suitable proportions of aluminum oxide (e.g., $Al_2O_3$, K=10, barrier height 2.8 eV) or another high-K dielectric material described below. In one specific embodiment, $HfO_2$ and $Al_2O_3$ may be provided, with a ratio of $HfO_2$ to $Al_2O_3$ ranging from about 1:4 to about to 4:1. Such a ratio may result in layer 140 having an effective barrier height ranging from about 1.7 to 2.5 eV. Intergate dielectric layer 140 may also be formed to a thickness of between about 140 and 185 Å, for example, resulting in an effective thickness of approximately 50 Å of $SiO_2$.

In another implementation consistent with principles of the invention, intergate dielectric layer 140 may include $HfO_2$ combined with suitable portions of $SiO_2$ (K=3.9, barrier height 3.5 eV). In one specific embodiment, $HfO_2$ and $SiO_2$ may be provided, with a ratio of $HfO_2$ to $SiO_2$ ranging from about 1:4 to about to 4:1 to generate an effective barrier height ranging from about 1.9 to 3.5 eV. Intergate dielectric layer 140 may also be formed to a thickness of between about 90 and 210 Å, for example, resulting in an effective thickness of approximately 50 Å of $SiO_2$. Intergate dielectric layer 140 may also be deposited by atomic layer deposition (ALD) techniques or other conventional techniques in which one or more layers of $HfO_2$ may be deposited, followed by deposition of one or more layers of $Al_2O_3$ or $SiO_2$. Alternatively, the ALD deposition process may alternate between $HfO_2$ layer(s) and $Al_2O_3$ (or $SiO_2$) layer(s).

It is understood that the present invention is not limited to the specific dielectric materials disclosed herein, but may include any appropriate mixture or combination of high-K dielectric materials which are known and are compatible with the remaining elements of the semiconductor device with which the dielectric materials are to be used.

It should be noted that the K-values, or relative permittivity, for high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material. As used herein, when a material is referred to by a specific chemical name or formula, the material may include non-stoichiometric variations of the stoichiometrically exact formula identified by the chemical name.

Control gate 145 may be positioned on top of intergate dielectric layer 140. Control gate 145 may be made of typical, well-known metal gate electrode materials, such as, for example, polysilicon, TiN, or TaN. Exemplary control gate 145 may have a thickness of between about 500 and 2000 Å.

Not shown in FIG. 1 are additional structures of a final semiconductor device, such as various conductive layers, interlayer dielectrics, contacts, protective coatings and other parts of the structure which would be included in a complete, working semiconductor device. These additional structures are not shown or described for simplicity and brevity. Nevertheless, how such structures could be formed will be easily understood by those of skill in the art.

Figure 2:
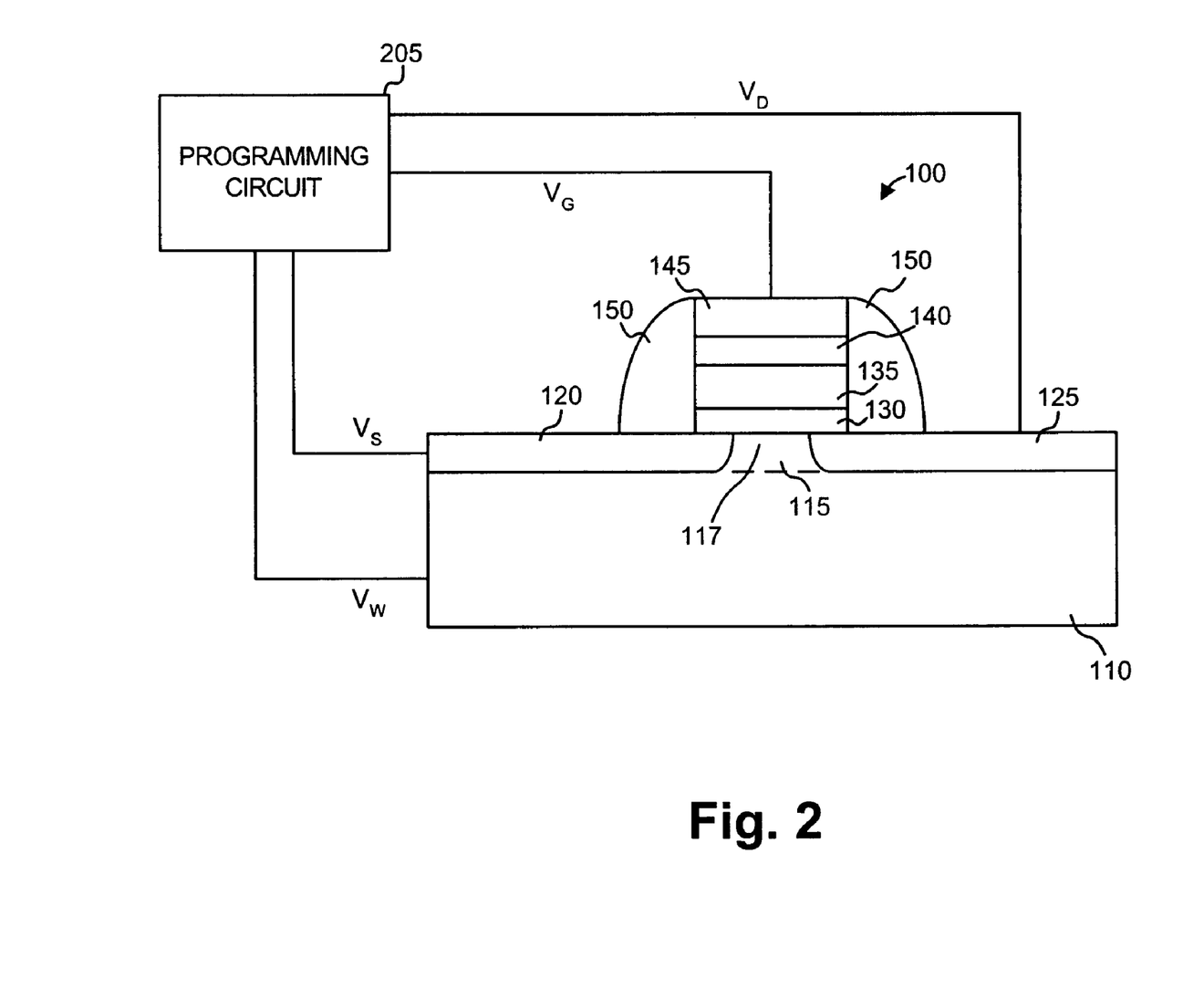
FIG. 2 is a front view of the semiconductor device shown in FIG. 1.

FIG. 2 is a front view of semiconductor device 100. A programming circuit 205 is additionally shown in FIG. 2. Programming circuit 205 may be used to program/erase semiconductor device 100. For instance, for a program operation, programming circuit 205 may inject electrons into charge storage layer 135. The injected electrons become trapped in charge storage layer 135 and cause the threshold voltage of device 100 to increase. When in this state, device 100 can be interpreted to be at a first logical state (e.g., logic 1 or high). To erase the state of device 100, programming circuit 205 may adjust the various voltages, such that Fowler-Nordheim (F-N) tunneling injects holes into charge storage layer 135 that cancel the previously injected electrons. The threshold voltage of device 100 will then decrease. When in this state, device 100 can be interpreted to be at a second logical state (e.g., logic 0 or low).

As shown in FIG. 2, programming circuit 205 may be electrically connected to memory device 100 via four control lines: drain line $V_D$, gate line $V_G$, source line $V_S$, and well line $V_W$. Well line $V_W$ may connect to the well or body of the semiconductor substrate 110.

Figure 3:
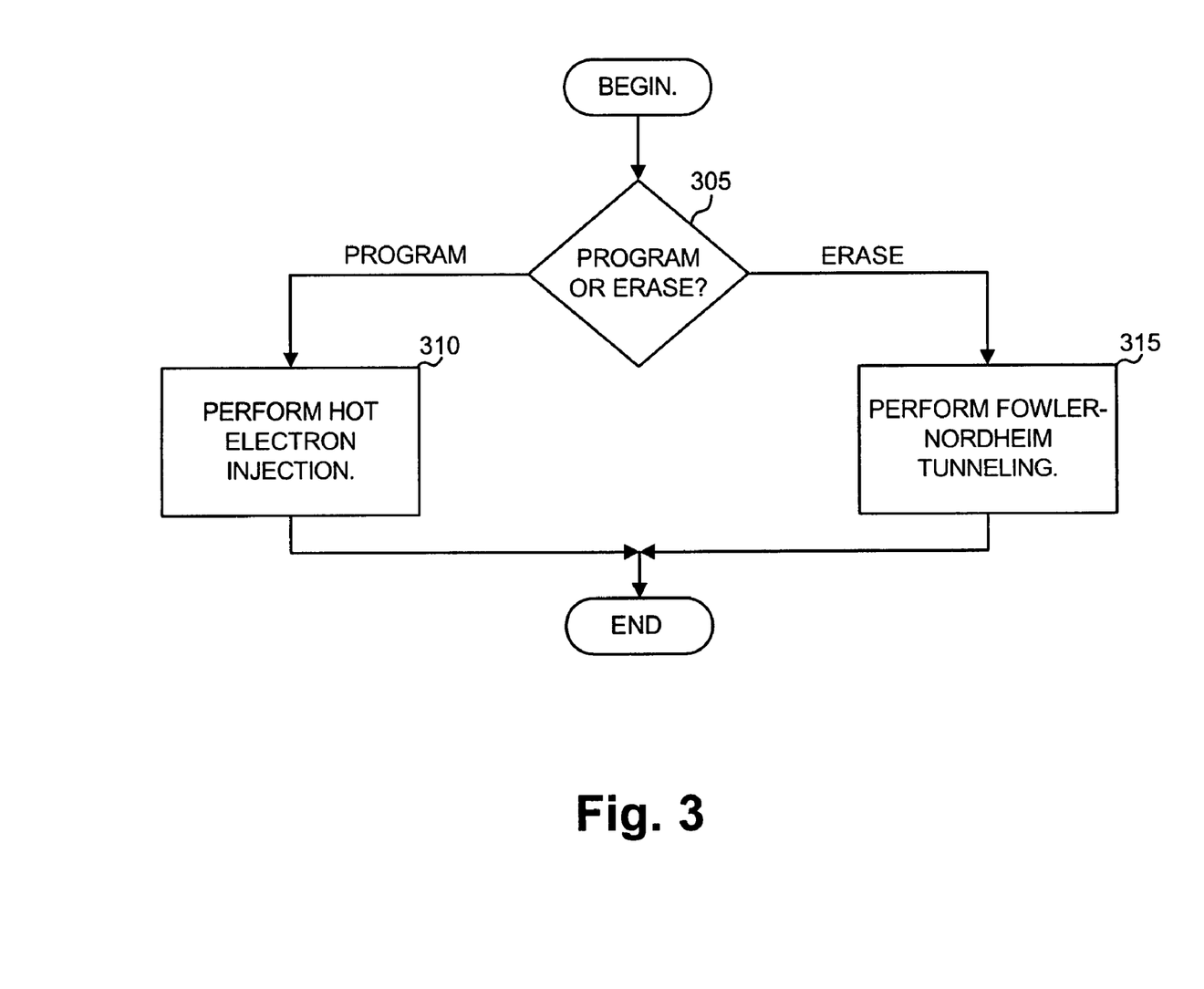
FIG. 3 is a flow chart illustrating operations performed by the programming circuit shown in FIG. 2.

FIG. 3 is a flow chart illustrating operations performed by programming circuit 205 in additional detail. It may first be determined whether a program (i.e., a "write") or erase operation is being requested (act 305). In the case of a program operation, this operation may be performed by hot electron injection (act 310). Hot electron injection is a known technique for programming memory cells. In alternate implementations, other programming techniques may be used to inject charge into charge storage layer 135. These applied potentials generate a vertical electric field through stack structure 105 and a lateral electric field along the length of channel 117 from source 120 to drain 125. The lateral electric field causes electrons to be drawn off source 120 and begin accelerating towards drain 125. As the electrons move along the length of the channel 117, the electrons gain energy and upon attaining enough energy, the electrons jump over the potential barrier of the gate dielectric 130 and into the charge storage layer 135, where the electrons become trapped.

In the case of an erase operation, programming circuit 205 may use F-N tunneling to remove charge from charge storage layer 135 (acts 305 and 315). In F-N tunneling, programming circuit 205 may apply a positive voltage to $V_G$, such as, for example, 20 volts, with $V_D$ and $V_S$ being connected to ground. This causes a bias from active region 115 to charge storage layer 135 across gate dielectric 130 sufficient to cause F-N tunneling so that electrons are removed from charge storage layer 135. Removing electrons from charge storage layer 135 decreases the threshold voltage of device 100.

The F-N tunneling operation is made possible due to high-K, high barrier height intergate dielectric layer 140. As discussed above, without the high-K, high barrier height intergate dielectric layer 140 (i.e., using a conventional oxide layer or other conventional dielectric materials), a F-N tunneling erase may tend to cause back gate injection. In back gate injection, electrons moving from charge storage layer 135 to channel 117 cause an increasing bias across intergate dielectric 140, which may, when a non-high-K dielectric is used for the intergate dielectric, eventually cause tunneling of electrons from control gate 145 to charge storage layer 135. The electrons that tunnel from control gate 145 to charge storage layer 135 due to back gate injection will offset (saturate) the electrons that are being effectively removed from charge storage layer 135 due to F-N tunneling. This "saturation problem" in conventional memory cells can make it difficult to effectively erase the cell using F-N tunneling. Moreover, even conventional high-K intergate dielectrics suffer from poor leakage current performance and its relative effect on erase times due to lower effective barrier heights. The mixture or combination of materials discussed above result in a high-K, high barrier height intergate dielectric layer 140 which improves erase speed and effectively eliminates back gate injection.

For clarity, the acts in FIG. 3 corresponding to the program and erase operation are shown simply as single acts 310 and 315. In practice, programming circuit 205 may, as is known in the art, perform other operations in accomplishing these acts. For example, in performing either or both of acts 310 and 315, programming circuit 205 may, after programming or erasing a memory cell, verify that the program or erase operation was successful. If not successful, programming circuit may re-perform the HHI (program) or F-N tunneling (erase) operation in order to add or remove, respectively, additional electrons from charge storage layer 135.

METHOD OF MANUFACTURE

Figure 4:
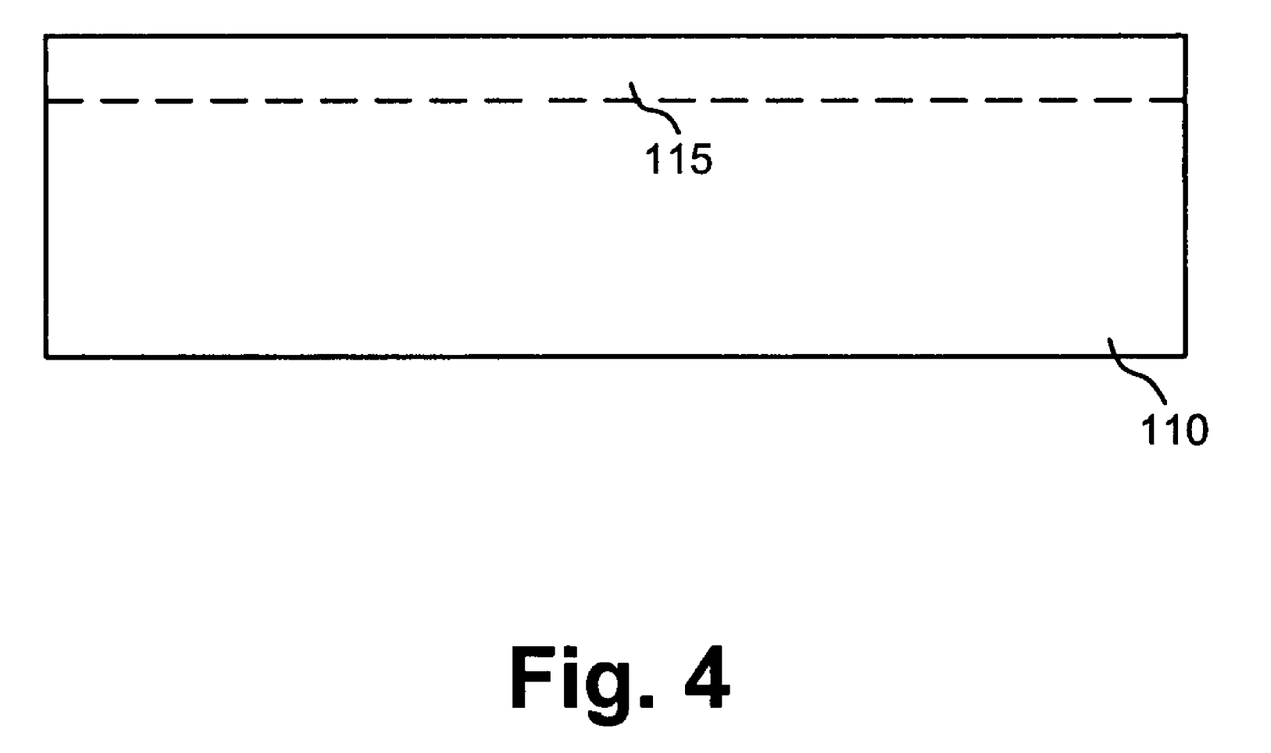
FIGS. 4-9 are diagrams illustrating an exemplary method of manufacturing the device shown in FIG. 1.

FIGS. 4-9 are diagrams illustrating an exemplary method of manufacturing device 100. To begin, as shown in FIG. 4, semiconductor substrate 110 is provided. Semiconductor substrate 110 may be any appropriately selected semiconductor substrate known in the art. Semiconductor substrate 110 may be subjected to implants to provide the active region 115 in semiconductor substrate 110 as is known in the art. For instance, boron or indium may be implanted to form a p-type region or channel for an n-type device and phosphorous or arsenic may be implanted to form an n-type region or channel for a p-type device.

Figure 5:
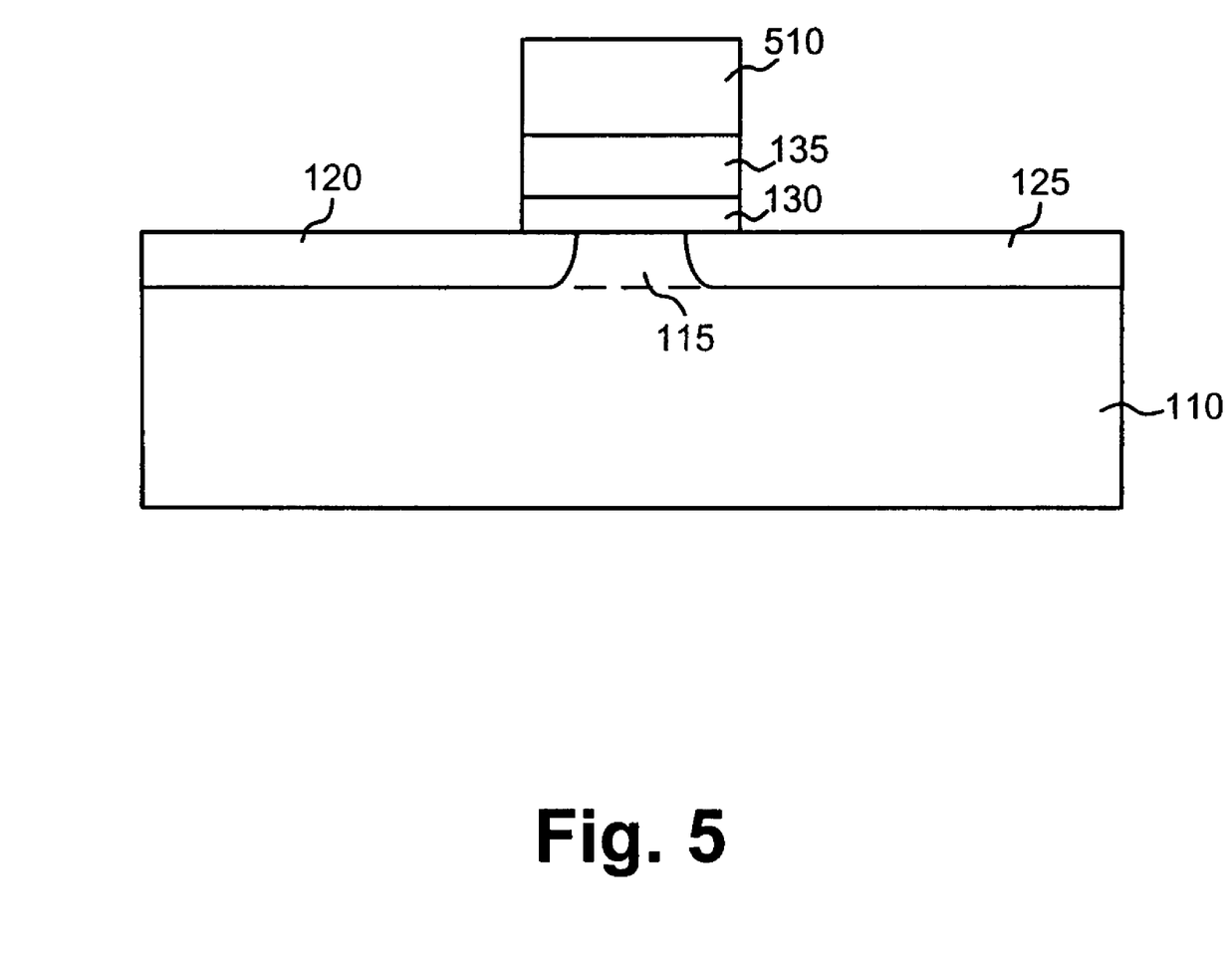

Now referring to FIG. 5, gate dielectric 130 of $SiO_2$ may be formed on the semiconductor substrate 110. Gate dielectric 130 may be thermally grown or deposited to a thickness between 20 and 100 angstroms. Charge storage layer 135 may be formed on gate dielectric 130. Charge storage layer 135 may be formed as a nitride layer (e.g., $Si_3N_4$) and may be deposited to a thickness between about 20 and 100 Å.

Next, a protective layer 510 may be formed on the charge storage layer 135. Protective layer 510 may be formed in order to protect the charge storage layer 135 from, for example, boron penetration, during an implant process to form source region 120 and drain region 125.

Although source region 120 and drain region 125 are shown as single implantation regions, it should be understood that extension implantation may be done in order to form extension regions as is known in the art. It should also be understood that the formation of source region 120 and drain region 125 may take place before the formation of the charge storage layer 135 or after the formation of vertical stack 105.

Figure 6:
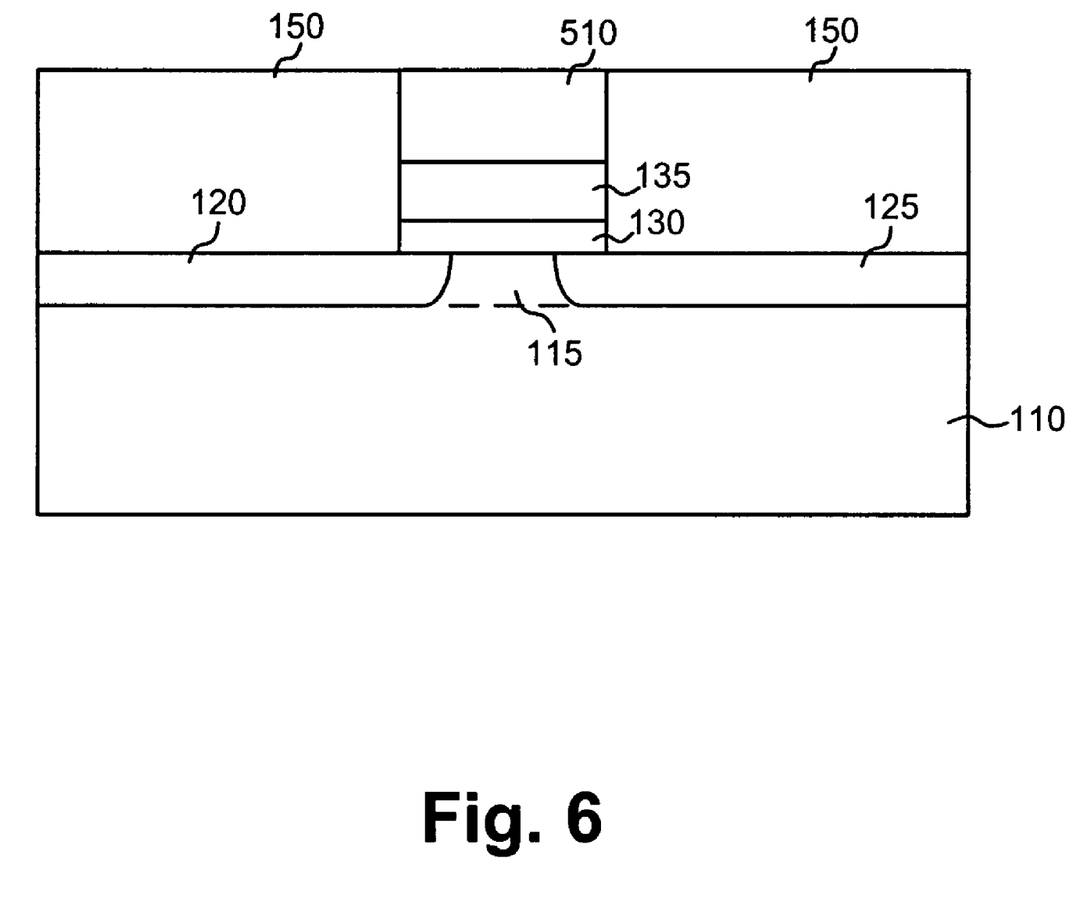

Referring to FIG. 6, a spacer layer 150 may be deposited on the semiconductor substrate 110. Next, spacer layer 150 may be polished back to the top surface of protective layer 510. The polishing may be done using conventional techniques, which are well-known in the art. The spacer layer 150 may be a TEOS (tetraethylorthosilicate) layer or other spacer material known to those skilled in the art.

Protective layer 510 may next be etched down to the charge storage layer 135. Thus, protective layer 510 may be removed to leave an upper surface of the charge storage layer 135 exposed. It should be appreciated that any suitable selective etching methods well-known in the art may be used.

Figure 7:
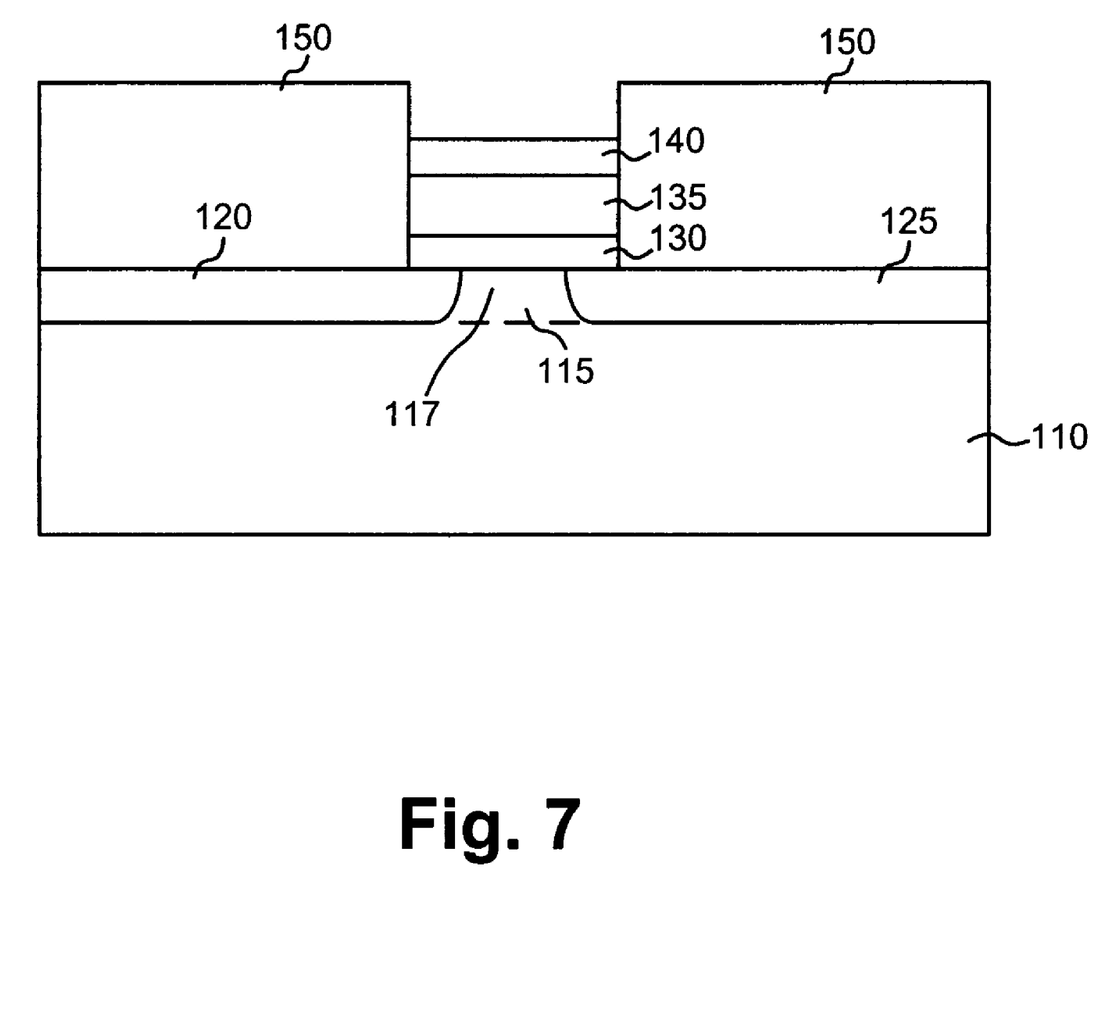

With reference to FIG. 7, the intergate dielectric layer 140 of high-K, high barrier height dielectric material (as described above) is formed on charge storage layer 135 in an opening defined by spacer layer 150. In an exemplary embodiment, intergate dielectric layer 140 is formed of $HfO_2$ and $SiO_2$ mixed in a 4:1 ratio, resulting in a combined effective K-value of approximately 16 and an effective barrier height of approximately 1.9 eV.

In accordance with an implementation consistent with principles of the invention, intergate dielectric layer 140 may be formed by chemical vapor deposition (CVD). The CVD method may be any appropriate CVD method known in the art. For example, the CVD method may be co-flow CVD, ALD (atomic layer chemical vapor deposition), PECVD (plasma enhanced CVD), RTCVD (rapid thermal CVD) or MLD (molecular layer chemical vapor deposition).

As is known in the art, CVD is a chemical process for depositing thin films of various materials. In a typical CVD process the substrate layer is exposed to one or more volatile precursors, which react and/or decompose on the substrate surface to produce the desired deposit. Volatile byproducts that may be produced during the deposition process are typically removed by gas flow through the reaction chamber.

In accordance with one embodiment consistent with principles of the invention, high-K, high barrier height layer 140 may be formed using a co-flow CVD, where all precursors, mixed together with a specific target mixture ratio, are injected into the reaction chamber at the same time. For example, for $HfO_2$ and $SiO_2$ materials, Hf and Si precursors are used with an oxygen (O) source. In one specific implementation, Hf and Si precursors are combined in a target mixture ratio of between 10:1 and 1:10 and injected at a rate of approximately 10 to 500 sccm (standard cubic centimeters per minute).

In another implementation consistent with principles of the invention, ALD (atomic layer chemical vapor deposition) is used to form high-K, high barrier height layer 140. In this implementation, each of the applied precursors (e.g., Hf and Al) are flowed into the reaction chamber alternatively. For example, for $HfO_2$ and $Al_2O_3$, precursors or gases may be applied in the following flow sequence: O source+Hf source; O source+Al source; O source+Hf source, etc. until a desired thickness has been deposited. Additionally, the ratio of $HfO_2:Al_2O_3$ may be adjusted based on the particular circuit requirements.

Following the formation of intergate dielectric layer 140 described above, the high-K, high barrier height layer 140 is thermally annealed in the range of about 700° C. to 1100° C.

Figure 8:
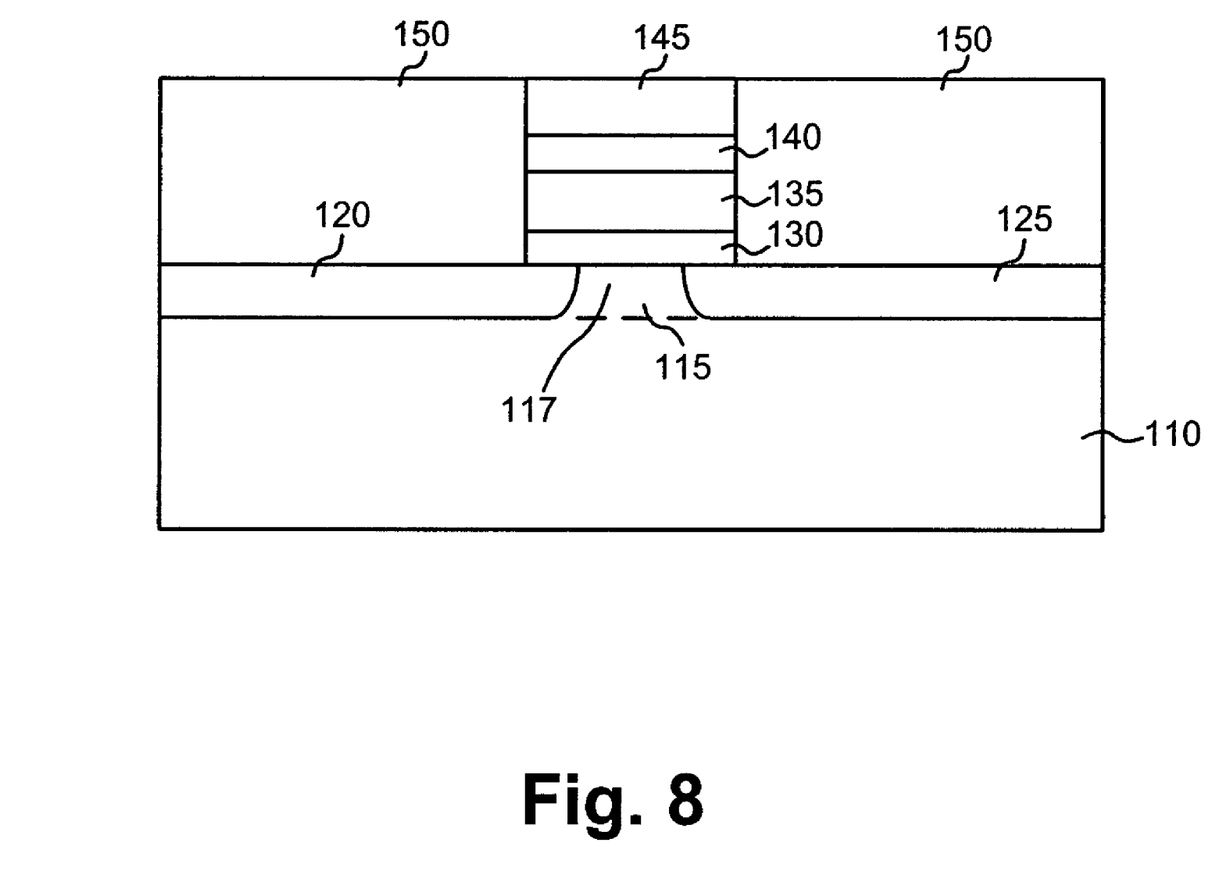
Figure 9:
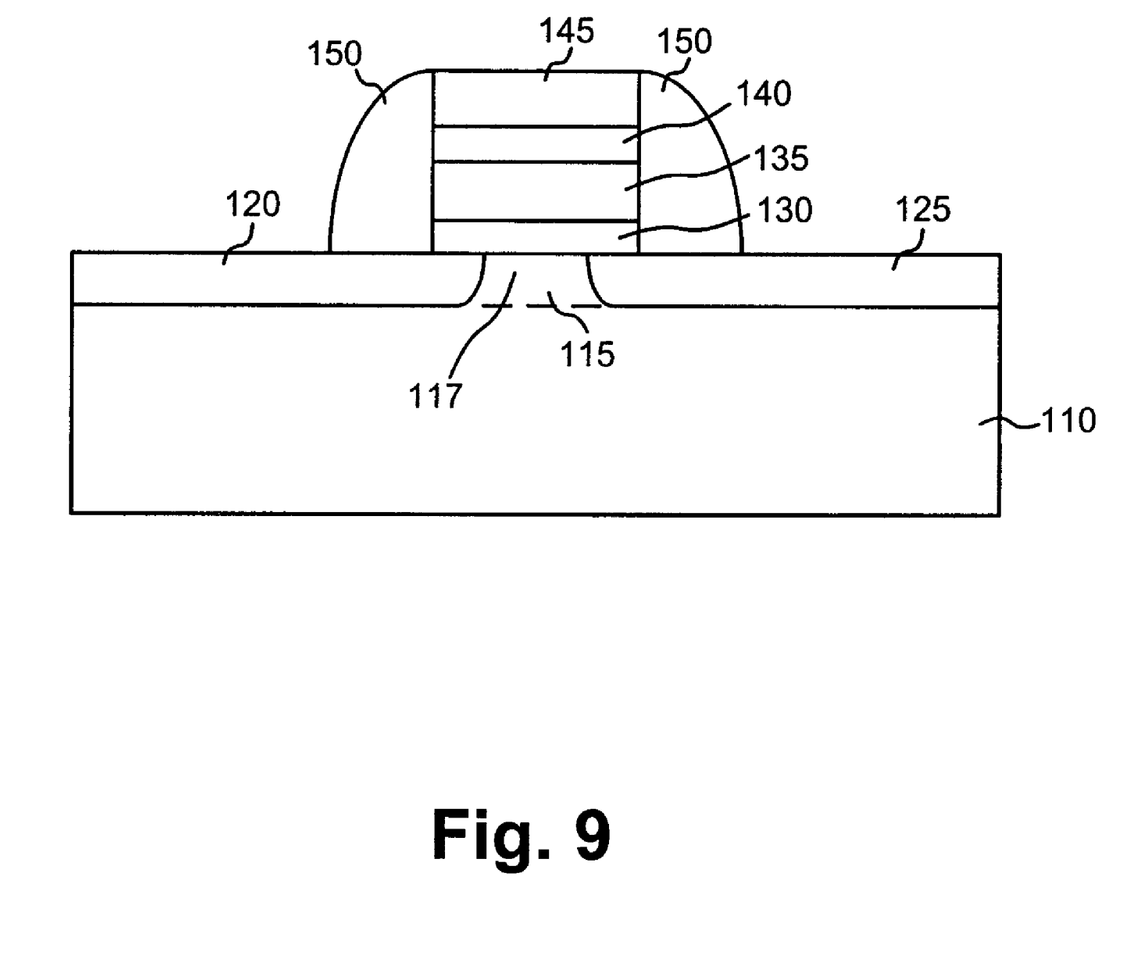

Referring to FIG. 8, an undoped polysilicon layer 145 may be deposited on the intergate dielectric layer 140 through the opening defined by spacer layer 150. Next, the undoped polysilicon layer 145 may be polished back to be even with the upper surface of the spacer layer 150. The polishing may be done using conventional techniques, which are well-known in the art. The polysilicon may then be doped using an implantation step to implant the polysilicon. Alternatively, layer 145 may be pre-doped.

Subsequently, connections such as word lines and bit lines may be formed using conventional techniques in order to establish electrical connections between the semiconductor device 100 and other nodes (such as programming circuit 205). The formation of the connections are not shown, for simplicity.

Spacer layer 150 may be additionally anisotropically etched with a suitable etchant. The spacer layer 150 is etched to expose the top surface of the semiconductor substrate 110 above source region 120 and drain region 125, forming the spacers 150 shown in FIG. 9.

EXEMPLARY SYSTEM

Figure 10:
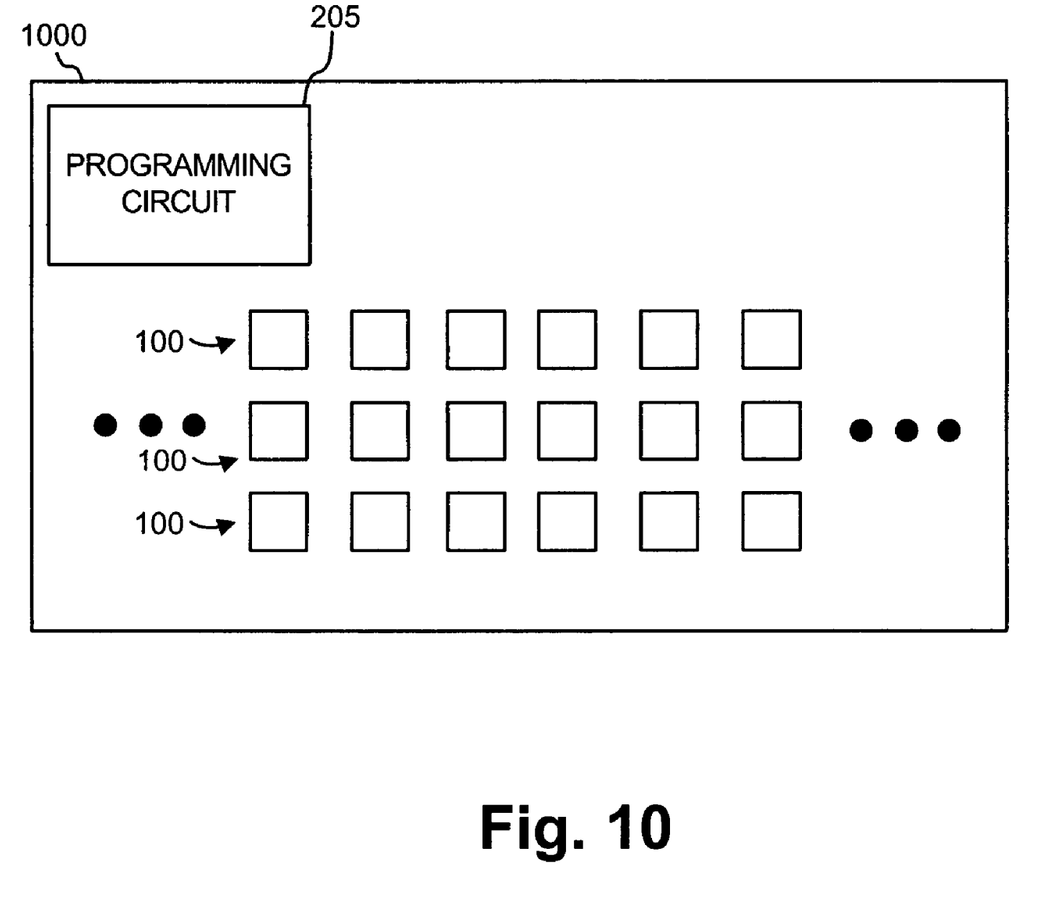
FIG. 10 is a diagram illustrating a system of semiconductor devices, such as those shown in FIG. 1, implemented on a single integrated circuit.

FIG. 10 is a diagram illustrating a system of semiconductor devices 100 implemented on a single integrated circuit 1000. In one implementation consistent with principles of the invention, semiconductor devices 100 may each be memory cells that each store one or two bits of data. Integrated circuit 1000 may contain many thousands or millions of semiconductor devices 100 (i.e., memory cells) arranged as one or more memory arrays. Semiconductor devices 100 may be programmed/erased by programming circuit 205, as previously described.

CONCLUSION

Although particular embodiments of the invention have been described in detail, it is understood that the invention is not limited correspondingly in scope, but includes all changes, modifications and equivalents coming within the spirit and terms of the claims appended hereto. Additionally, although the flowchart of FIG. 3 shows a specific order of execution, it is understood that the order of execution may differ from that which is depicted. Also, two or more blocks shown in succession in FIG. 3 may be executed concurrently or with partial concurrence.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device comprising:
   a gate dielectric formed on a substrate;
   a charge storage layer formed on the gate dielectric;
   a single intergate dielectric layer formed on the charge storage layer, the single intergate dielectric layer including a first material having a dielectric constant (K) value to prevent back gate injection and a second material having a barrier height to reduce current leakage,
   wherein the first material and the second material are mixed together and wherein the single intergate dielectric layer has a thickness of between about 90 and 210 Å and a barrier height of between about 1.7 and 3.5 electron volts (eV); and
   a control gate formed above the single intergate dielectric layer.

2. The memory device of claim 1, wherein the single intergate dielectric layer has a K value greater than that of $SiO_2$ and a barrier height greater than that of $HfO_2$.

3. The memory device of claim 1, wherein the first material comprises at least one of hafnium silicate, hafnium silicon oxynitride, hafnium silicon nitride, hafnium dioxide, zirconium dioxide, or tantalum oxide and wherein the second material comprises at least one of aluminum oxide or silicon dioxide.

4. The memory device of claim 3, wherein the single intergate dielectric layer includes a mixture of hafnium dioxide and aluminum oxide in a ratio of about 4:1.

5. The memory device of claim 3, wherein the single intergate dielectric layer includes a mixture of hafnium dioxide and silicon dioxide in a ratio ranging from about 4:1 to about 1:4.

6. The memory device of claim 5, wherein the single intergate dielectric layer has a thickness of between about 90 and about 210 Å.

7. An integrated circuit comprising:
   an array of memory cells formed on a semiconductor substrate, each of the memory cells including:
     a gate dielectric formed on the substrate,
     a charge storage layer formed on the gate dielectric,
     an single intergate dielectric layer formed on the charge storage layer, the single intergate dielectric layer comprising an about 4:1 mixture of a first material having a high dielectric constant (K) value and a second material having a high barrier height,
   and
   a control gate formed above the single intergate dielectric layer.

8. The integrated circuit of claim 7, further comprising:
   a programming circuit configured to perform an erase operation of one or more of the memory cells in the array by removing charge from the charge storage layer using Fowler-Nordheim tunneling,
   wherein the single intergate dielectric layer has a K value greater than that of silicon dioxide.

9. The integrated circuit of claim 8, wherein the first material comprises at least one of hafnium silicate, hafnium silicon oxynitride, hafnium silicon nitride, hafnium dioxide, zirconium dioxide, or tantalum oxide and wherein the second material comprises at least one of aluminum oxide or silicon dioxide.

10. The integrated circuit of claim 9, wherein the single intergate dielectric layer comprises a mixture of hafnium dioxide and aluminum oxide having a barrier height between about 1.5 and 3.9.

11. The integrated circuit of claim 9 wherein the single intergate dielectric layer has a thickness of between about 90 and about 210 Å.

* * * * *